(12) United States Patent
Ganusov

(10) Patent No.: US 10,340,898 B1
(45) Date of Patent: Jul. 2, 2019

(54) CONFIGURABLE LATCH CIRCUIT

(71) Applicant: Xilinx, Inc., San Jose, CA (US)

(72) Inventor: Ilya K. Ganusov, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/632,236

(22) Filed: Jun. 23, 2017

(51) Int. Cl.
| | |
|---|---|
| *H03K 3/037* | (2006.01) |
| *H03K 3/289* | (2006.01) |
| *H03K 3/356* | (2006.01) |
| *H03K 5/135* | (2006.01) |
| *H03K 19/173* | (2006.01) |

(52) U.S. Cl.
CPC ........... *H03K 3/0372* (2013.01); *H03K 3/289* (2013.01); *H03K 3/356052* (2013.01); *H03K 5/135* (2013.01); *H03K 19/1733* (2013.01)

(58) Field of Classification Search
CPC ............. H03K 3/0372; H03K 3/35606; H03K 3/356052; H03K 3/35625; H03K 3/356156; H03K 3/356147; H03K 3/356104; H03K 3/356095; H03K 3/356–3/3562
See application file for complete search history.

(56) References Cited

U.S. PATENT DOCUMENTS

| | | | | |
|---|---|---|---|---|
| 4,691,122 A | * | 9/1987 | Schnizlein | G11C 19/28 327/203 |
| 6,064,246 A | * | 5/2000 | Endo | G11C 19/00 327/202 |
| 6,518,810 B1 | * | 2/2003 | Takahashi | H03K 3/012 327/202 |
| 6,633,995 B1 | * | 10/2003 | Nam | G06F 9/3869 712/E9.063 |
| 7,253,661 B1 | * | 8/2007 | Tuan | H03K 3/356052 326/46 |
| 7,317,773 B2 | | 1/2008 | Young et al. | |
| 9,007,110 B1 | * | 4/2015 | Gaide | H03K 3/02335 327/173 |
| 9,018,980 B1 | | 4/2015 | Durairajan et al. | |
| 9,281,807 B1 | | 8/2016 | Maillard et al. | |
| 9,531,351 B1 | | 12/2016 | Delvin et al. | |
| 2005/0116756 A1 | * | 6/2005 | Kim | H03K 3/037 327/218 |
| 2006/0273837 A1 | * | 12/2006 | Shimazaki | G01R 31/318575 327/202 |
| 2008/0238476 A1 | * | 10/2008 | Lewis | G06F 17/5054 326/40 |
| 2008/0250285 A1 | * | 10/2008 | Pacha | G01R 31/318552 714/726 |
| 2011/0066906 A1 | * | 3/2011 | Tang | G01R 31/31858 714/731 |
| 2011/0231723 A1 | * | 9/2011 | Lee | G06F 11/24 714/731 |
| 2016/0358638 A1 | * | 12/2016 | Langhammer | G11C 8/18 |

OTHER PUBLICATIONS

U.S. Appl. No. 15/196,466, filed Jun. 29, 2016, Devlin et al., San Jose, CA, USA.

* cited by examiner

*Primary Examiner* — Thomas J. Hiltunen
(74) *Attorney, Agent, or Firm* — LeRoy D. Maunu

(57) ABSTRACT

The disclosed pulsed latched circuitry includes first and second latch circuits. The first and second latch circuits can be provided with additional logic circuit components to permit them to be operated as a flip-flop circuit, or as a FIFO circuit with a depth of two.

20 Claims, 5 Drawing Sheets

CONFIGURABLE LATCH CIRCUIT

TECHNICAL FIELD

The disclosure generally relates to latches, and more particularly to pulsed latch circuits.

BACKGROUND

A simple flip-flop circuit can be formed from two level-sensitive latches, sometimes referred to as "master" and "slave" latches. These latches typically have identical structure. The first latch in the data path (the master latch) receives an inverted version of an input clock signal that is received by the second latch in the data path (the slave latch). As a result, when the input clock signal pulses (goes high), the slave latch opens, while the master latch doses. When the dock signal drops, the slave latch doses and the master latch opens. The present disclosure provides improvements on the present state of the art, as described below.

SUMMARY

Various example implementations described herein are directed to pulsed latch circuits. In some implementations, a pulsed latched circuit is provided that includes first and second latch circuits. Each latch circuit has a respective data input node, a respective data output node, and a respective clock input node. The data output node of the first latch circuit is coupled to the data input node of the second latch circuit. The pulsed latch circuit further includes a clock control circuit coupled to the first and second latch circuits. The clock control circuit is configured to provide, in response to an input clock signal, a first clock pulse to the clock input node of the second latch circuit and a second clock pulse that is based on an inversion of the first clock pulse to the clock input node of the first latch circuit, wherein in a single cycle of the input clock signal, the second latch circuit, responsive to the first clock pulse, opens and stores state of the signal at the output node of the first latch circuit, and the first latch circuit, responsive to the second clock pulse, opens and stores state of a signal at the input node of the first latch, and further wherein the clock control circuit is selectively configurable to cause the first and second latch circuits to store values from two successive clock cycles, or cause the first and second latch circuits to cooperate to store a value from a single clock cycle.

In various implementations, pulse widths of the first clock pulse and second clock pulse are each shorter in duration than a pulse width of the input clock signal. For example, the first clock pulse and second clock pulse can each rise and fall during the pulse of the input clock signal.

In some implementations, the clock control circuit of the pulsed latch circuit can include a first pulse generator that is configured to be triggered by the input clock signal. The first clock signal can be generated by the first pulse generator in response to the input clock signal. If desired, the clock control circuit can include a second pulse generator that is configured to be triggered by an inversion of the first clock signal. The second clock signal can be generated by the second pulse generator in response to the inversion of the first clock signal.

In various implementations, the pulsed latch circuit can further include a first multiplexer, and a further control circuit coupled to the first multiplexer. The first multiplexer can include a first multiplexer input node coupled to an output node of the first pulse generator, a second multiplexer input node coupled to the input clock signal, and a first multiplexer output node coupled to the clock input node of the second latch circuit. The first multiplexer can be configured to choose, in response to receiving at least one control signal from the further control circuit, an incoming signal by way of the first input node or the second input node, and to pass through the incoming signal to the clock input node of the second latch circuit. If desired, the pulsed latch circuit can further include a second multiplexer coupled to the further control circuit. The second multiplexer includes a third multiplexer input node coupled to an output node of the second pulse generator, a fourth multiplexer input node coupled to the input clock signal, and a second multiplexer output node coupled to the clock input node of the first latch circuit. The second multiplexer can be configured to choose, in response to receiving the at least one control signal from the further control circuit, an incoming signal by way of the third input node or the fourth input node and to pass through the incoming signal to the clock input node of the first latch circuit.

In some implementations, the first and second multiplexers are configured to operate the first and second latch circuits in a first mode of operation as a single flip-flop type circuit in response to the at least one control signal having a first value. In this mode of operation, the first value of the control signal causes the first and second multiplexers to pass through the input clock signal to the first and second latch circuits. The first and second multiplexers can also be configured to operate the first and second latch circuits in a second mode of operation as a two-stage FIFO circuit in response to the at least one control signal having a second value. In this second mode of operation, the second value of the control signal causes the first and second multiplexers to pass through signals received from the pulse generators to the first and second latch circuits. In various implementations, the first latch circuit and second latch circuit are edge triggered latch circuits.

In some implementations, the clock control circuit of the pulsed latch circuit can further include a programmable delay circuit disposed between an output node of the first pulse generator and a clock input node of the first latch circuit, such as between the first pulse generator and the second pulse generator. The programmable delay circuit is typically configurable to introduce a delay in propagating a signal to the first latch circuit. The disclosure still further provides implementations of a configurable logic block ("CLB") including one or more pulsed latch circuits as set forth herein.

The disclosure also provides implementations of a method of operating a pulsed latch circuit. The method includes coupling a data output node of a first latch circuit to a data input node of a second latch circuit. The method further includes providing a first clock pulse based on an input clock signal to a clock input node of the second latch circuit, and providing a second clock pulse based on an inversion of the first clock-based pulse to a clock input node of the first latch circuit. In a single cycle of the input clock signal, the second latch circuit, responsive to the first clock pulse, opens and stores state of a first signal at the output node of the first latch circuit, and the first latch circuit, responsive to the second clock pulse, opens and stores state of a second signal at the input node of the first latch.

In some implementations of the method, each of the first and second latch circuits can be configured to be selectively coupled to the input clock signal, or a signal generated in response to the input clock signal, through first and second multiplexers. The first and second multiplexers selectively couple one of the input clock signal and signal generated in response to the incoming clock signal to the clock input node of each of the first and second latch circuits in response to a control signal received from a further control circuit. In some implementations, the first and second multiplexers can be configured to, in a first mode of operation, operate the first and second latch circuits as a single flip-flop type circuit in response to the at least one control signal having a first value. The first value of the control signal causes the first and second multiplexers to pass through the input clock signal to the first and second latch circuits. If desired, the pulsed latch circuit can be operated in a second mode of operation, wherein the first and second latch circuits are operated as a two-stage FIFO circuit in response to the at least one control signal having a second value. The second value of the control signal causes the first and second multiplexers to pass through signals received from at least one pulse generator to the first and second latch circuits.

The disclosure further provides implementations of a programmable integrated circuit (IC). An illustrative programmable integrated circuit includes programmable logic circuits, programmable interconnect circuits, and a configuration controller configured to program the programmable logic circuits and programmable interconnect circuits according to a set of configuration data stored in a non-volatile memory coupled to the programmable IC. The programmable logic circuits include at least one pulsed latch circuit disposed within a configurable logic block ("CLB"). The pulsed latch circuit includes first and second latch circuits. Each latch circuit has a respective data input node, a respective data output node, and a respective clock input node. The data output node of the first latch circuit is coupled to the data input node of the second latch circuit. The pulsed latch circuit further includes a clock control circuit coupled to the first and second latch circuits and configured to provide a first clock pulse to the clock input node of the second latch circuit and provide a second clock pulse that is based on an inversion of the first clock pulse to the clock input node of the first latch circuit.

The clock control circuit of the pulsed latch circuit of the programmable IC typically includes pulse generators, a further control circuit and multiplexers. For example, a first pulse generator can be provided that is configured to be triggered by an input clock signal. The first clock signal is generated by the first pulse generator in response to the input clock signal. A second pulse generator can be provided that is configured to be triggered by an inversion of the first clock signal. The second clock signal is generated by the second pulse generator in response to the inversion of the first clock signal. A first multiplexer can be provided that is coupled to a further control circuit. The first multiplexer has a first multiplexer input node coupled to an output node of the first pulse generator, a second multiplexer input node coupled to the input clock signal, and a first multiplexer output node coupled to the clock input node of the second latch circuit. The first multiplexer can be configured to choose, in response to receiving at least one control signal from the further control circuit, an incoming signal by way of the first input node or the second input node and to pass through the incoming signal to the clock input node of the second latch circuit. A second multiplexer can be provided that is coupled to the further control circuit. The second multiplexer has a third multiplexer input node coupled to an output node of the second pulse generator, a fourth multiplexer input node coupled to the input clock signal, and a second multiplexer output node coupled to the clock input node of the first latch circuit. The second multiplexer is configured to choose, in response to receiving the at least one control signal from the further control circuit, an incoming signal by way of the third input node or the fourth input node and to pass through the incoming signal to the clock input node of the first latch circuit.

In some implementations, the first and second multiplexers of the pulsed latch circuit of the programmable IC can be configured to operate the first and second latch circuits in a first mode of operation as a single flip-flop type circuit in response to the at least one control signal having a first value, wherein the first value of the control signal causes the first and second multiplexers to pass through the input clock signal to the first and second latch circuits. The first and second multiplexers of the pulsed latch circuit of the programmable IC can be configured to operate the first and second latch circuits in a second mode of operation as a two-stage FIFO circuit in response to the at least one control signal having a second value, wherein the second value of the control signal causes the first and second multiplexers to pass through signals received from the pulse generators to the first and second latch circuits. The programmable IC can further include a programmable delay circuit disposed between an output node of the first pulse generator and an input node of the second pulse generator. The programmable delay circuit can be configurable to introduce a delay in propagating a signal to the first latch circuit.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
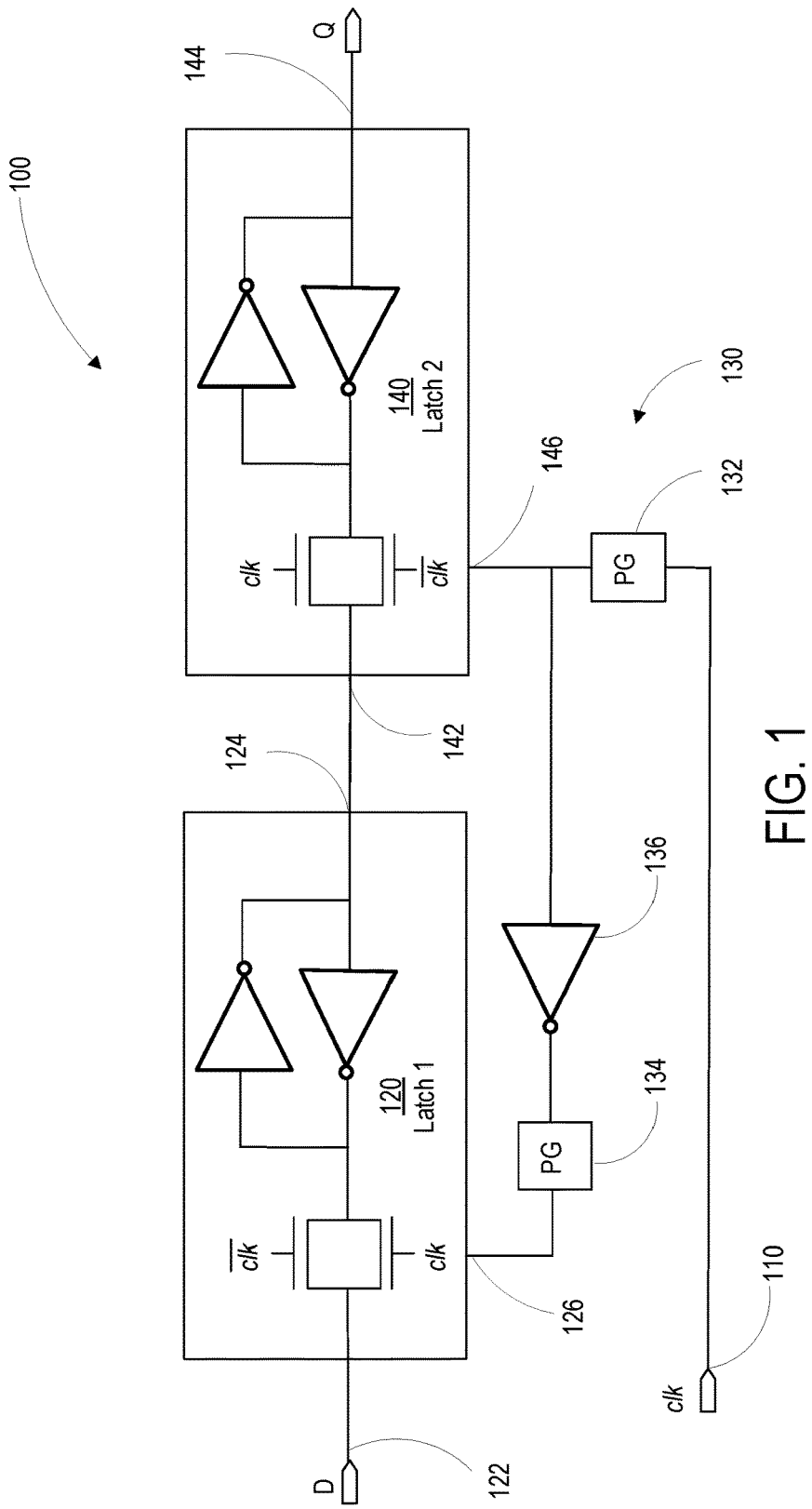
FIG. 1 shows a first implementation of a configurable pulsed latch circuit.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same (or similar) reference numerals may be used in different diagrams to refer to the same elements or additional instances of the same element.

In a traditional flip-flop described in the Background section above, two storage elements are used to capture and store one value per cycle. The disclosed circuitry, in contrast, can improve storage efficiency of latches by selectively (e.g., programmably) modifying clocking to enable latches to store values from two different clock cycles, essentially converting a flip-flop into a FIFO with a depth of two.

This configurability can be achieved, for example, by adding logic on the clock path of the latch circuits without affecting the data path. This can effectively double the storage capacity of an existing flip-flop. This approach permits one to effectively double the number of sequential elements in field programmable gate array (FPGA) fabric with a very small impact on area and performance. This approach is backward-compatible with Applicant's existing architecture, and does not affect timing on the data path when the 2-deep FIFO mode is not used.

The disclosed approaches typically require small area overhead, since pulse generators can actually be shared among many flip-flops. The disclosed circuitry can be expected to improve the density of FPGA fabric, thus improving cost, power, and performance of FPGAs.

For purposes of illustration, and not limitation, in some implementations, to convert a conventional Flip-Flop into a two-stage FIFO, it is contemplated to augment clock paths of the two latches forming flip-flop with two pulse generators (PG).

With reference to FIG. 1, an illustrative implementation of a pulsed latched circuit 100 is presented that includes first and second latch circuits 120, 140. Each latch circuit 120, 140 has a respective data input node 122, 142, a respective data output node 124, 144, and a respective clock input node 126, 146. The data output node 124 of the first latch circuit 120 is coupled to the data input node 142 of the second latch circuit 140. The pulsed latch circuit 100 further includes a clock control circuit 130 coupled to the first and second latch circuits 120, 140. The clock control circuit 130 is configured to provide, in response to an input clock signal 110, a first clock pulse to the clock input node 146 of the second latch circuit 140, and a second clock pulse that is based on an inversion, via inverter 136, of the first clock pulse to the clock input node 126 of the first latch circuit 120. Thus, in a single cycle of the input clock signal 110, the second latch circuit 140, responsive to the first clock pulse, opens and stores state of the signal at the output node 124 of the first latch circuit 120, and the first latch circuit 120, responsive to the second clock pulse, opens and stores state of a signal at the input node 122 of the first latch 120. The clock control circuit 130, preferably, is selectively configurable (e.g., programmable) to cause the first and second latch circuits 120, 140 to store values from two successive clock cycles, or to cause the first and second latch circuits to cooperate to store a value from a single clock cycle.

In various implementations, pulse widths of the first clock pulse and second clock pulse are each shorter in duration than a pulse width of the input clock signal. For example, the first clock pulse and second clock pulse can each rise and fall during the pulse of the input clock signal.

In some implementations, the clock control circuit (130) of the pulsed latched circuit 100 can include a first pulse generator (132) that is configured to be triggered by the input clock signal (110). The first clock signal can be generated by the first pulse generator (132) in response to the input clock signal (110). If desired, the clock control circuit (130) can include a second pulse generator (134) that is configured to be triggered by an inversion of the first clock signal (110). The second clock signal can be generated by the second pulse generator (134) in response to the inversion of the first clock signal.

Figure 2:
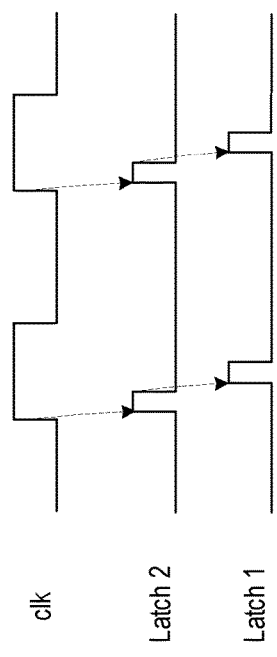
FIG. 2 illustrates the propagation of clock pulses generated by pulse generators in response to a clock input signal.

For purposes of illustration, and not limitation, with reference to FIG. 2, each of the pulse generators (e.g., 132, 134) is triggered directly, or indirectly, by the positive edge of the incoming input clock signal ("clk"). As shown on the waveform, the clock pulse received by Latch 2 (e.g., 140) is generated by pulse generator 132, which in turn is triggered by the rising edge of the incoming clock signal ("clk"). This new clock pulse that has just been generated by pulse generator 132 gets inverted by inverter 136, and passed on two another pulse generator 134. Pulse generator 134 is also an edge sensitive latch circuit, and is triggered by the rising pulse of the inversion of the clock pulse generated by pulse generator 132. Thus, the inversion of the falling edge of the Latch 2 (e.g., 140) pulse (generated by pulse generator 132) is transformed into a rising clock signal by the inverter 136, which triggers pulse generator 134 to generate a further clock signal that then propagates to Latch 1 (e.g., 120). The arrows presented on the illustrative waveforms of FIG. 2 indicate the causation between the incoming clock signal 110, the pulse generators 132, 134, and the inverter 136.

Figure 3:
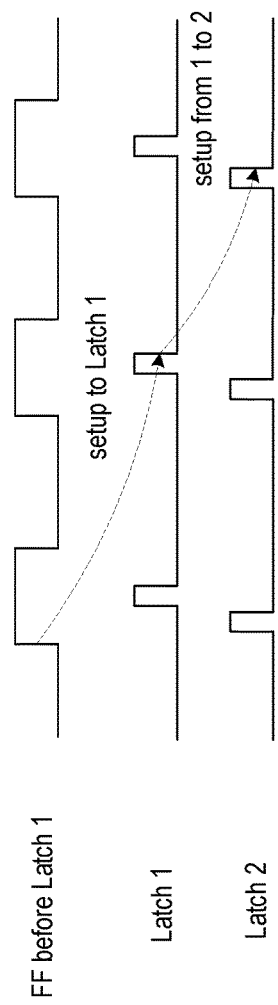
FIG. 3 illustrates the movement of data corresponding to the propagation of clock pulses set forth in FIG. 2.

Given this clocking sequence, as illustrated in FIG. 3, it is possible to trace the movement of data within a single clock cycle. Accordingly, when Latch 2 (e.g., 140) is pulsed via pulse generator 132, it opens and overwrites its internal state, thus propagating the data value that was stored in Latch 1 (e.g., 120). After Latch 2 (e.g., 140) closes (on the falling edge of Latch 2 pulse from pulse generator 132), Latch 1 (e.g., 120) opens and overwrites its internal state with a new data value of the input D. As a result, in a single clock cycle the two latches 120, 140 can be configured to store two distinct values. Specifically, Latch 1 (e.g., 120) will store the current value of D, while Latch 2 (e.g., 140) will store the value of D from a previous cycle. This therefore results in functionality of a two-deep FIFO.

Figure 4A:
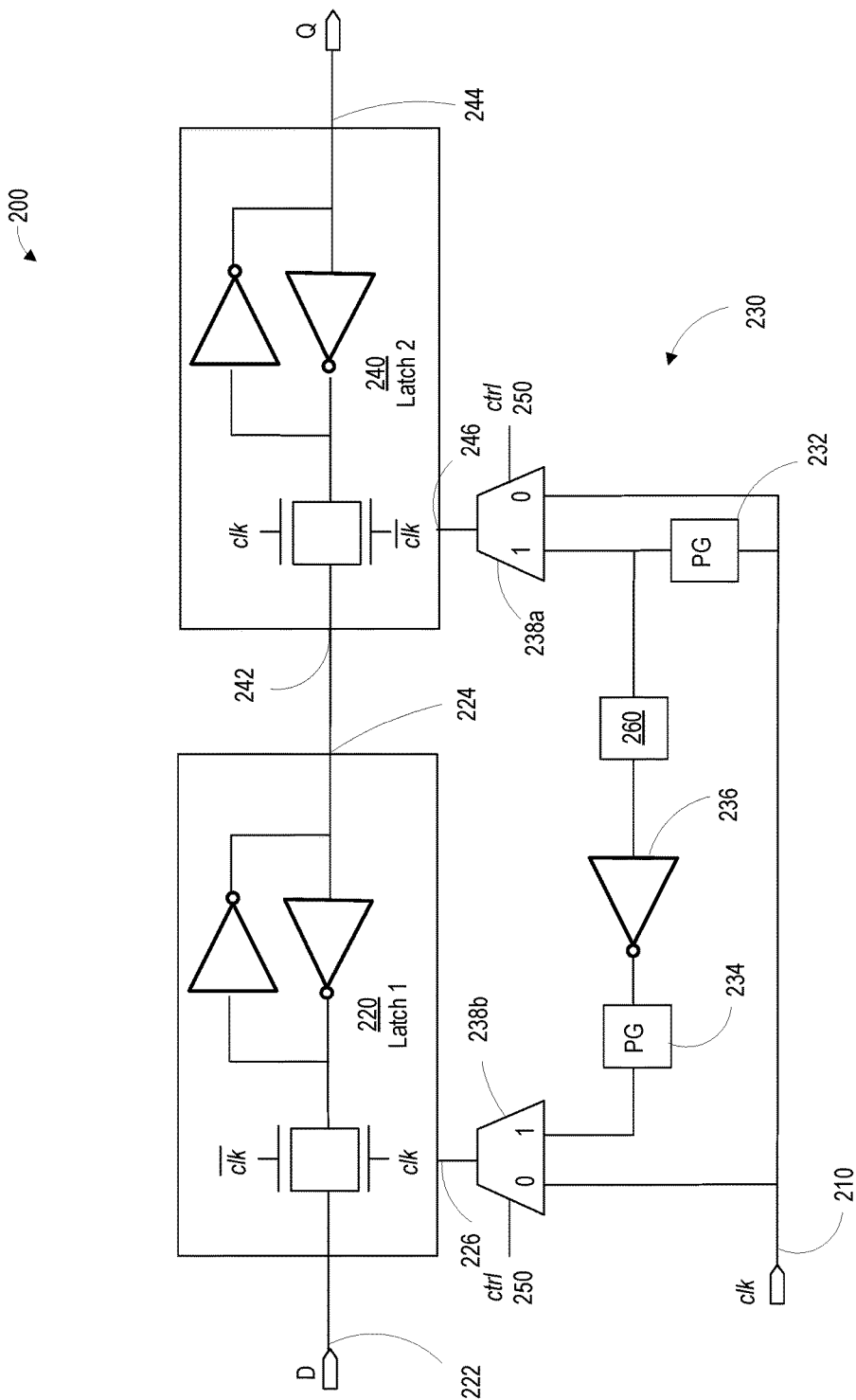
FIG. 4A shows a variation of a configurable pulsed latch circuit in accordance with the present disclosure that includes configurable multiplexers.

With further reference to the drawings, as illustrated in FIG. 4A, a pulsed latch circuit 200 is presented that further includes a first multiplexer 238a, and a further control circuit 250 coupled to the first multiplexer 238a. The first multiplexer 238a can include a first multiplexer input node coupled to an output node of the first pulse generator 232, a second multiplexer input node coupled to the input clock signal 210, and a first multiplexer output node coupled to the clock input node 246 of the second latch circuit 240.

The first multiplexer 238a can be configured to choose, in response to receiving at least one control signal from the further control circuit 250, an incoming signal by way of the first input node or the second input node, and to pass through the incoming signal to the clock input node 246 of the second latch circuit. As illustrated, the pulsed latch circuit further includes a second multiplexer 238b that is also coupled to the further control circuit 250. The second multiplexer 238b includes a third multiplexer input node coupled to an output node of the second pulse generator 234, a fourth multiplexer input node coupled to the input clock signal 210, and a second multiplexer output node coupled to the clock input node 226 of the first latch circuit 220. The second multiplexer 238b can be configured to choose, in response to receiving the at least one control signal from the further control circuit 250, an incoming signal by way of the third input node or the fourth input node and to pass through the incoming signal to the clock input node 226 of the first latch circuit 220.

In some implementations, the first and second multiplexers 238a, 238b are configured to operate the first and second latch circuits 220, 240 in a first mode of operation as a single flip-flop type circuit in response to the at least one control signal having a first value. In this mode of operation, the first value of the control signal causes the first and second multiplexers 238a, 238b to pass through the input clock signal 210 to the first and second latch circuits. The first and second multiplexers can also be configured to operate the first and second latch circuits 220, 240 in a second mode of operation as a two-stage FIFO circuit in response to the at least one control signal having a second value. In this second mode of operation, the second value of the control signal causes the first and second multiplexers 238a, 238b to pass through signals received from the pulse generators 232, 234 to the first and second latch circuits 220, 240. In various implementations, the first latch circuit 120, 220 and second latch circuit 140, 240 are edge triggered latch circuits.

Accordingly, with continuing reference to FIG. 4A, to make the circuit programmable between a first mode where it functions as a traditional flip-flop and a second mode where it functions as a 2-deep FIFO, two additional multiplexers (e.g., 238a, 238b) are provided on the clock inputs 226, 246 to each latch circuit 220, 240. These multiplexers 238a, 238b can be configured to choose between a regular clock signal 220, or pulses generated by pulse generators 232, 234. Thus, when operating in a "conventional" flip-flop mode, the multiplexers are programmed to choose input "0". When the multiplexers are used in the 2-deep FIFO mode, they are programmed to use input 1.

Note that while the two-deep FIFO mode provides better storage capacity, it has hold characteristics that are not necessarily as good as the FF mode. Since latch 120/220 is driven by a pulse generated on a falling edge of the pulse generated by pulse generator 132/232, its incoming hold constraint decreases by an amount equal to the pulse width of latch 140 plus the pulse width of latch 120. It is therefore preferred that the two-deep FIFO mode be used when an incoming hold constraint is not violated or can be fixed.

In some implementations, and as further illustrated in FIG. 4A, the clock control circuit 230 of the pulsed latch circuit 200 can further include a programmable delay circuit 260 disposed between an output node of the first pulse generator 234 and a clock input node 226 of the first latch circuit 220, such as between the first pulse generator 234 and an input node of the second pulse generator 232, or between an output node of the second pulse generator and the clock input node 226 of the first latch circuit, either before or after the multiplexer 238b. The programmable delay circuit 260 is typically configurable to introduce a delay in propagating a signal to the first latch circuit 220 to provide for additional flexibility in operation.

The disclosure also provides methods of operating a pulsed latch circuit. An illustrative method includes coupling a data output node (e.g., 124, 224) of a first latch circuit (e.g., 120, 220) to a data input node (e.g., 142, 242) of a second latch circuit (e.g., 140, 240). The method further includes providing a first clock pulse based on an input clock signal (e.g., 110, 210) to a clock input node (e.g., 146, 246) of the second latch circuit (e.g., 140, 240), and providing a second clock pulse based on an inversion, via inverter 236, of the first clock-based pulse to a clock input node (e.g., 126, 226) of the first latch circuit (e.g., 120, 220). In a single cycle of the input clock signal (e.g., 110, 210), the second latch circuit (e.g., 140, 240), responsive to the first clock pulse, opens and stores state of the signal at the output node (e.g., 124, 224) of the first latch circuit (e.g., 120, 220), and the first latch circuit (e.g., 120, 220), responsive to the second clock pulse, opens and stores state of a signal at the input node (e.g., 122, 222) of the first latch (e.g., 120, 220).

In some implementations of the method, each of the first and second latch circuits (e.g., 220, 240) can be configured to be selectively coupled to the input clock signal (e.g., 210), or a signal generated in response to the input clock signal, through first and second multiplexers (e.g., 238a, 238b). The first and second multiplexers (e.g., 238a, 238b) selectively couple one of the input clock signal (210) and signal generated in response to the incoming clock signal to the clock input node (e.g., 226, 246) of each of the first and second latch circuits (e.g., 220, 240) in response to a control signal received from a further control circuit (e.g., 250). In some implementations, the first and second multiplexers (e.g., 238a, 238b) can be configured to, in a first mode of operation, operate the first and second latch circuits (e.g., 220, 240) as a single flip-flop type circuit in response to the at least one control signal having a first value. The first value of the control signal causes the first and second multiplexers (e.g., 238a, 238b) to pass through the input clock signal (e.g., 220) to the first and second latch circuits (e.g., 220, 240). If desired, the pulsed latch circuit can be operated in a second mode of operation, wherein the first and second latch circuits (e.g., 220, 240) are operated as a two-stage FIFO circuit in response to the at least one control signal having a second value. The second value of the control signal causes the first and second multiplexers to pass through signals received from at least one pulse generator to the first and second latch circuits (e.g., 220, 240).

The configurable latch circuits may be adapted for use in a number of applications that utilize latching circuits. The configurable latch circuits are thought to be particularly applicable for use in programmable integrated circuits (ICs) which may be programmed for various applications. One type of PLD, the field programmable gate array (FPGA), typically includes an array of programmable tiles. These programmable tiles comprise various types of logic blocks, which can include, for example, the disclosed configurable latching circuits, input/output blocks (IOBs), dedicated random access memory blocks (BRAM), multipliers, digital signal processing blocks (DSPs), processors, clock managers, delay lock loops (DLLs), bus or network interfaces. The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Figure 4B:
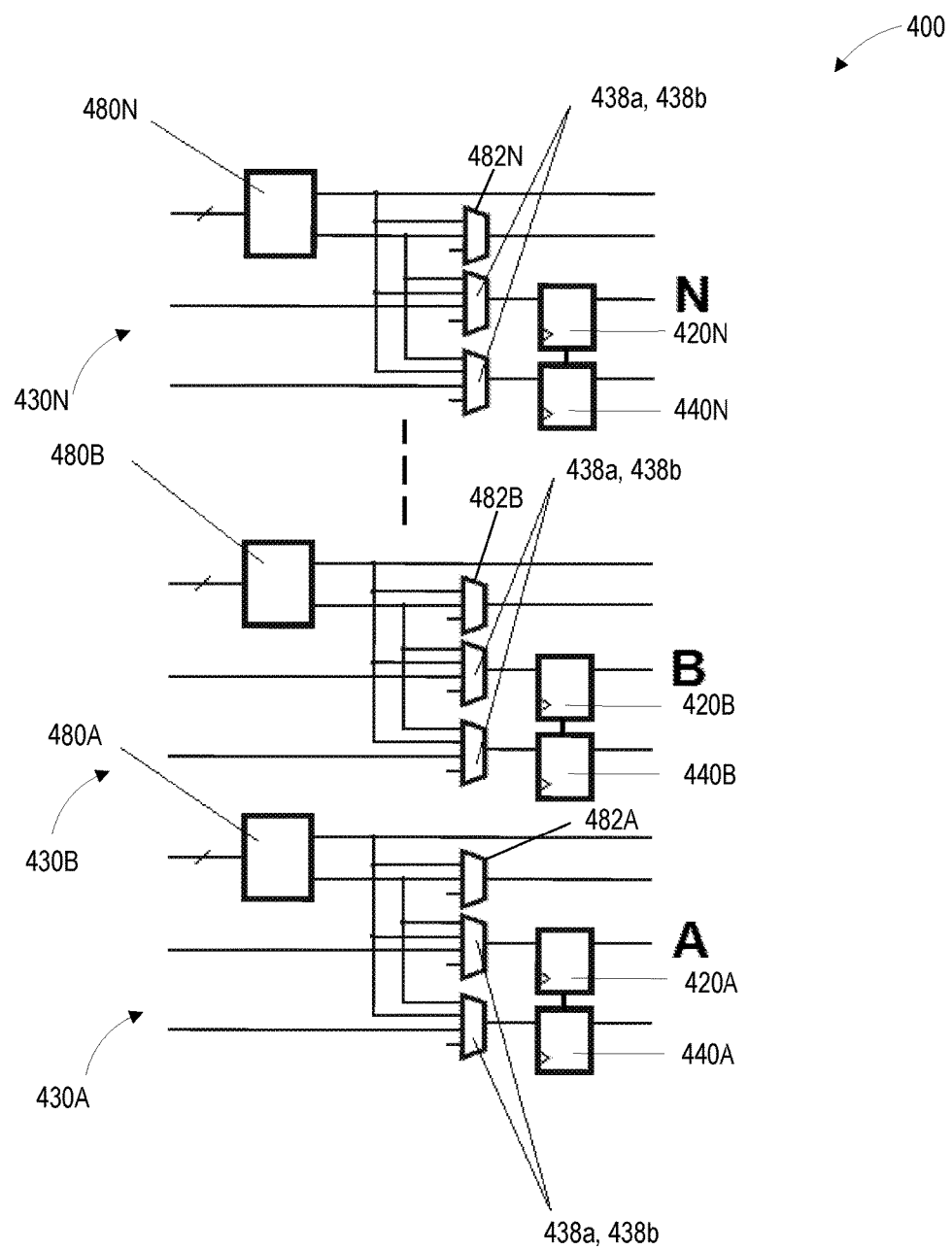
FIG. 4B presents a configurable logic block ("CLB") including configurable pulsed latch circuits.

In further accordance with the present disclosure, as presented in FIG. 4B, an illustrative configurable logic block ("CLB") CLB 400 is provided in accordance with UltraScale™ architecture from Xilinx, Inc. The CLB 400 is a central resource for implementing general-purpose combinatorial and sequential circuits. The CLB 400 is made up of logic circuit elements, which are grouped together in a slice, along with interconnect routing resources to connect the logic elements. Utilization of slices, their placement in an ultimate device, and routing between them can be optimized via use of automatic tools. As illustrated, a plurality of lookup tables ("LUT"s) 480A . . . 480N are provided that are coupled to latch circuit pairs 420A, 440A . . . 420N, 440N and multiplexers 438a, b, as well as clock control circuits 430A, 430B and 430N. The CLB can be programmed by one or more further control circuits (e.g., 250) to operate the latches in a first mode of operation as a flip-flop, and in a second mode of operation as a FIFO circuit with a depth of two. Latching of output from the LUTs 480A, 480B, . . . 480N can be bypassed by control of multiplexers 482A, 482B, . . . 482N, respectively.

The disclosure further provides a programmable integrated circuit (IC). The programmable integrated circuit includes programmable logic circuits, programmable interconnect circuits, and a configuration controller configured to program the programmable logic circuits and programmable interconnect circuits according to a set of configuration data stored in a non-volatile memory coupled to the programmable IC. The programmable logic circuits include at least one pulsed latch circuit (e.g., 200) as disclosed herein disposed within a configurable logic block ("CLB", e.g., 400).

Figure 5:
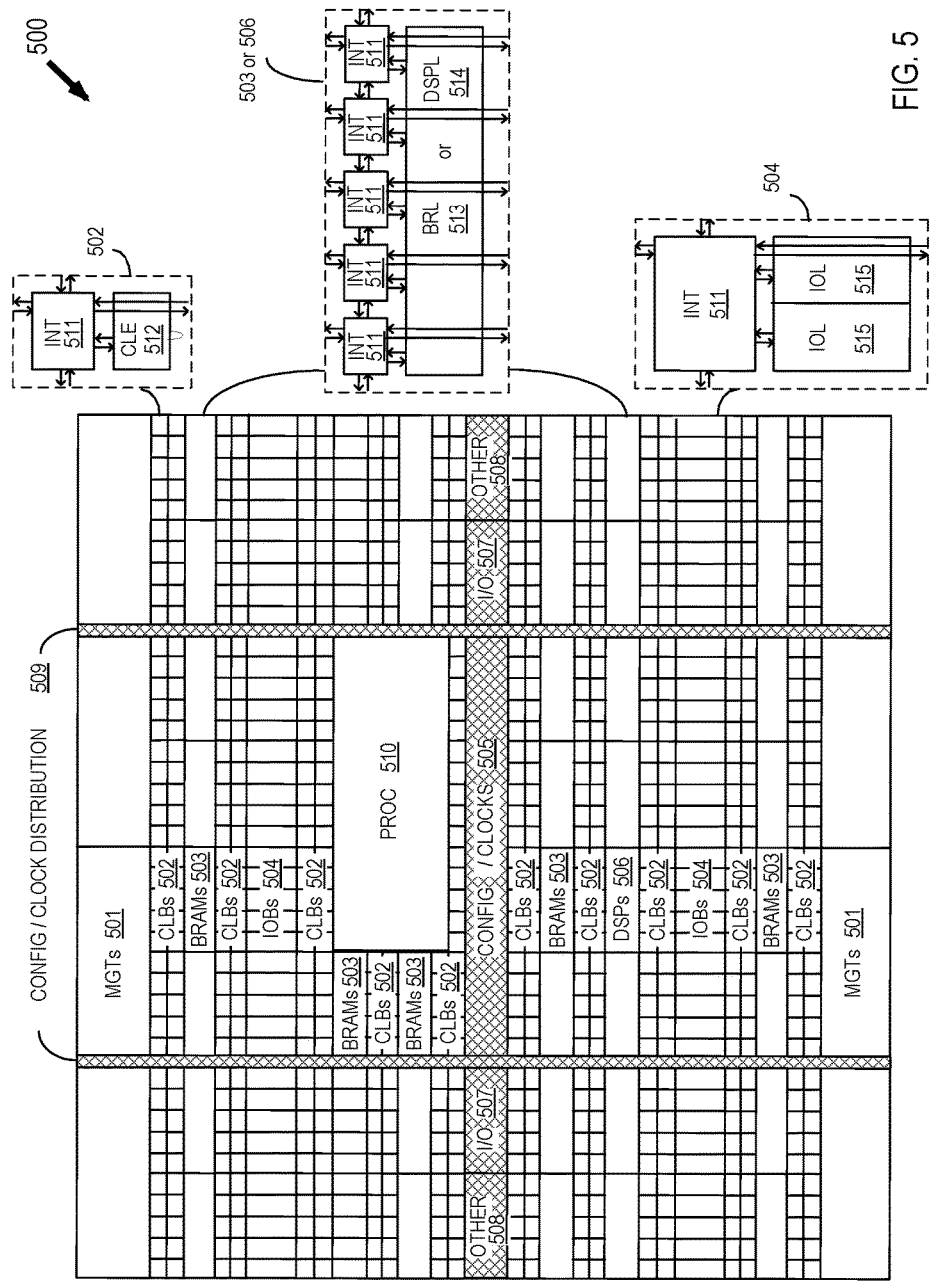
FIG. 5 shows an example programmable IC that may be adapted to include the disclosed configurable latch circuits.

FIG. 5 shows a programmable integrated circuit (IC) 500 on which the disclosed circuits and processes may be implemented. The programmable IC may also be referred to as a System on Chip (SOC) that includes field programmable gate array logic (FPGA) along with other programmable resources. FPGA logic may include several different types of programmable logic blocks in the array. For example, FIG. 5 illustrates a programmable IC 500 that includes a large number of different programmable tiles including multi-gigabit transceivers (MGTs) 501, configurable logic blocks (CLBs) 502 (such as CLB 400 in FIG. 4B, including configurable latches as disclosed herein), blocks of random access memory (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Often, the number of interconnect elements included in a tile depends on the height of the tile. In the pictured implementation, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured implementation, a columnar area near the center of the die (shown shaded in FIG. 5) is used for configuration, clock, and other control logic. Horizontal areas 509 extending from the column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are provided purely as examples. For example, in an actual programmable IC, more than one adjacent column of CLBs is typically included wherever the CLBs appear, to facilitate the efficient implementation of user logic.

The methods and circuits are thought to be applicable to a variety of systems that utilize latching circuits. Other aspects and features will be apparent to those skilled in the art from consideration of the specification. For instance, although aspects and features may in some cases be described in individual figures, it will be appreciated that features from one figure can be combined with features of another figure even though the combination is not explicitly shown or explicitly described as a combination. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:
1. A pulsed latch circuit, comprising:
   first and second latch circuits, each latch circuit having a respective data input node, a respective data output node, and a respective clock input node, the data output node of the first latch circuit being coupled to the data input node of the second latch circuit; and
   a clock control circuit coupled to the first and second latch circuits and configured to:
      selectively provide, in response to a first state of a control signal, a first clock pulse that is based on an input clock signal to the clock input node of the second latch circuit and a second clock pulse that is based on an inversion of the first clock pulse to the clock input node of the first latch circuit to cause the first and second latch circuits to store values from two successive clock cycles,
      wherein in a single cycle of the input clock signal, the second latch circuit, responsive to the first clock pulse, opens and stores state of the signal at the output node of the first latch circuit, and the first latch circuit, responsive to the second clock pulse, opens and stores state of a signal at the input node of the first latch; and
      selectively provide, in response to a second state of the control signal, the input clock signal to the clock input nodes of the first and second latch circuits to cause the first and second latch circuits to cooperate to store a value from a single clock cycle.

2. The pulsed latch circuit of claim 1, wherein pulse widths of the first clock pulse and second clock pulse are each shorter in duration than a pulse width of the input clock signal.

3. The pulsed latch circuit of claim 1, wherein the first clock pulse and second clock pulse each rise and fall during the pulse of the input clock signal.

4. The pulsed latch circuit of claim 1, wherein the clock control circuit includes a first pulse generator that is configured to be triggered by the input clock signal, and the first clock pulse is generated by the first pulse generator in response to the input clock signal.

5. The pulsed latch circuit of claim 4, wherein the clock control circuit includes a second pulse generator that is configured to be triggered by an inversion of the first clock pulse, wherein the second clock signal is generated by the second pulse generator in response to the inversion of the first clock pulse.

6. The pulsed latch circuit of claim 5, further comprising a first multiplexer and a further control circuit coupled to the first multiplexer, the first multiplexer having a first multiplexer input node coupled to an output node of the first pulse generator, a second multiplexer input node coupled to the input clock signal, and a first multiplexer output node coupled to the clock input node of the second latch circuit, the first multiplexer being configured to choose, in response to the control signal from the further control circuit, an incoming signal by way of the first input node or the second input node and to pass through the incoming signal to the clock input node of the second latch circuit.

7. The pulsed latch circuit of claim 6, further comprising a second multiplexer coupled to the further control circuit, the second multiplexer having a third multiplexer input node coupled to an output node of the second pulse generator, a fourth multiplexer input node coupled to the input clock signal, and a second multiplexer output node coupled to the clock input node of the first latch circuit, the second multiplexer being configured to choose, in response to the control signal from the further control circuit, an incoming signal by way of the third input node or the fourth input node and to pass through the incoming signal to the clock input node of the first latch circuit.

8. The pulsed latch circuit of claim 7, wherein the first and second multiplexers are configured to:
 operate the first and second latch circuits in a first mode of operation as a single flip-flop type circuit in response to the second state of the control signal, wherein the second state of the control signal causes the first and second multiplexers to pass through the input clock signal to the first and second latch circuits; and
 operate the first and second latch circuits in a second mode of operation as a two-stage FIFO circuit in response to the first state of the control signal, wherein the first state of the control signal causes the first and second multiplexers to pass through signals received from the pulse generators to the first and second latch circuits.

9. The pulsed latch circuit of claim 1, wherein the first latch circuit and second latch circuit are edge triggered latch circuits.

10. The pulsed latch circuit of claim 5, wherein the clock control circuit further includes a programmable delay circuit disposed between an output node of the first pulse generator and the clock input node of the first latch circuit, the programmable delay circuit being configurable to introduce a delay in propagating a signal to the first latch circuit.

11. The pulsed latch circuit of claim 10, wherein the programmable delay circuit is disposed between the output node of the first pulse generator and an input node of the second pulse generator.

12. The pulsed latch circuit of claim 1 wherein:
 the clock control circuit includes a first pulse generator that is configured to be triggered by the input clock signal, and the first clock pulse is generated by the first pulse generator in response to the input clock signal;
 pulse widths of the first clock pulse and second clock pulse are each shorter in duration than a pulse width of the input clock signal; and
 the first clock pulse and second clock pulse each rise and fall during the pulse of the input clock signal.

13. A method, comprising,
 coupling a data output node of a first latch circuit to a data input node of a second latch circuit;
 selectively providing, in response to a first state of a control signal:
  a first clock pulse based on an input clock signal to a clock input node of the second latch circuit, and
  a second clock pulse based on an inversion of the first clock pulse to a clock input node of the first latch circuit to cause the first and second latch circuits to store values from two successive clock cycles,
 wherein in a single cycle of the input clock signal, the second latch circuit, responsive to the first clock pulse, opens and stores state of the signal at the output node of the first latch circuit, and the first latch circuit, responsive to the second clock pulse, opens and stores state of a signal at the input node of the first latch circuit; and
 selectively providing, in response to a second state of the control signal, the input clock signal to the clock input nodes of the first and second latch circuits to cause the first and second latch circuits to cooperate to store a value from a single clock cycle.

14. The method of claim 13, wherein:
 the clock input node of the first latch circuit is configured to, in response to the control signal, be selectively coupled to the input clock signal or the second clock pulse through a first multiplexer, and
 the clock input node of the second latch circuit is configured to, in response to the control signal, be selectively coupled to the input clock signal or the first clock pulse through a second multiplexer.

15. The method claim 14, wherein the first and second multiplexers are configured to:
 in a first mode of operation, operate the first and second latch circuits as a single flip-flop type circuit in response to the second state of the control signal, wherein the second state of the control signal causes the first and second multiplexers to pass through the input clock signal to the first and second latch circuits; and
 in a second mode of operation, operate the first and second latch circuits as a two-stage FIFO circuit in response to the first state of the control signal, wherein the first state of the control signal causes the first and second multiplexers to pass through signals received from at least one pulse generator to the first and second latch circuits.

16. A programmable integrated circuit (IC), comprising:
 programmable logic circuitry; and
 programmable interconnect circuitry, including respective pulsed latch circuits disposed within each of a plurality of configurable logic blocks ("CLB"), the pulsed latch circuits including:

first and second latch circuits, each of the first and second latch circuits having a respective data input node, a respective data output node, and a respective clock input node, wherein the data output node of the first latch circuit is coupled to the data input node of the second latch circuit; and a clock control circuit coupled to the first and second latch circuits and configured to:

selectively provide, in response to a first state of a control signal, a first clock pulse that is based on an input clock signal to the clock input node of the second latch circuit and a second clock pulse that is based on an inversion of the first clock pulse to the clock input node of the first latch circuit; and selective provide, in response to a second state of the control signal, the input clock signal to the clock input nodes of the first and second latch circuits to cause the first and second latch circuits to cooperate to store a value from a single clock cycle, wherein the clock control circuit includes:

a first pulse generator that is configured to be triggered by the input clock signal, wherein the first clock pulse is generated by the first pulse generator in response to the input clock signal; and a second pulse generator that is configured to be triggered by an inversion of the first clock pulse, wherein the second clock signal is generated by the second pulse generator in response to the inversion of the first clock pulse.

17. The programmable integrated circuit, of claim 16, wherein the clock control circuit further includes:

a further control circuit;

a first multiplexer coupled to the further control circuit, the first multiplexer having a first multiplexer input node coupled to an output node of the first pulse generator, a second multiplexer input node coupled to the input clock signal, and a first multiplexer output node coupled to the clock input node of the second latch circuit, the first multiplexer being configured to choose, in response to the control signal from the further control circuit, an incoming signal by way of the first input node or the second input node and to pass through the incoming signal to the clock input node of the second latch circuit; and a second multiplexer coupled to the further control circuit, the second multiplexer having a third multiplexer input node coupled to an output node of the second pulse generator, a fourth multiplexer input node coupled to the input clock signal, and a second multiplexer output node coupled to the clock input node of the first latch circuit, the second multiplexer being configured to choose, in response to the control signal from the further control circuit, an incoming signal by way of the third input node or the fourth input node and to pass through the incoming signal to the clock input node of the first latch circuit.

18. The programmable IC of claim 17, wherein the first and second multiplexers are configured to:

operate the first and second latch circuits in a first mode of operation as a single flip-flop type circuit in response to the second state of the control signal, wherein the second state of the control signal causes the first and second multiplexers to pass through the input clock signal to the first and second latch circuits; and operate the first and second latch circuits in a second mode of operation as a two-stage FIFO circuit in response to the first state of the control signal having a second value, wherein the first state of the control signal causes the first and second multiplexers to pass through signals received from the pulse generators to the first and second latch circuits.

19. The programmable IC of claim 18, further comprising a programmable delay circuit disposed between an output node of the first pulse generator and the clock input node of the first latch circuit, the programmable delay circuit being configurable to introduce a delay in propagating a signal to the first latch circuit.

20. The programmable IC of claim 19, wherein the programmable delay circuit is disposed between the output node of the first pulse generator and an input node of the second pulse generator.

* * * * *